United States Patent
Lee et al.

(10) Patent No.: US 8,811,549 B2
(45) Date of Patent: Aug. 19, 2014

(54) APPARATUS AND METHOD FOR AUTOMATICALLY CONTROLLING GAIN IN PORTABLE COMMUNICATION SYSTEM

(75) Inventors: Byeong-Min Lee, Seoul (KR); Yun-Ju Kwon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 507 days.

(21) Appl. No.: 12/578,349

(22) Filed: Oct. 13, 2009

(65) Prior Publication Data

US 2010/0098196 A1 Apr. 22, 2010

(30) Foreign Application Priority Data

Oct. 17, 2008 (KR) .................. 10-2008-0101997

(51) Int. Cl.
*H04L 27/08* (2006.01)
*H03G 3/30* (2006.01)

(52) U.S. Cl.
CPC ................... *H03G 3/3052* (2013.01)
USPC .......... 375/345; 375/260; 455/127.2

(58) Field of Classification Search
USPC .................. 375/345, 260
See application file for complete search history.

(56) References Cited

U.S. PATENT DOCUMENTS

| | | | |
|---|---|---|---|
| 6,317,065 B1 | 11/2001 | Raleigh et al. | |
| 7,970,066 B1 * | 6/2011 | Lee et al. | 375/260 |
| 2003/0025623 A1 | 2/2003 | Brueske et al. | |
| 2003/0078007 A1 * | 4/2003 | Parssinen et al. | 455/67.1 |
| 2006/0023800 A1 * | 2/2006 | Okada | 375/260 |
| 2006/0052070 A1 * | 3/2006 | Jin et al. | 455/127.2 |
| 2006/0220935 A1 | 10/2006 | Hughes et al. | |
| 2007/0258548 A1 | 11/2007 | Sutton | |
| 2008/0130799 A1 * | 6/2008 | Yousef et al. | 375/345 |
| 2009/0284300 A1 * | 11/2009 | Meyer | 327/348 |
| 2010/0080327 A1 * | 4/2010 | Zhang et al. | 375/345 |

FOREIGN PATENT DOCUMENTS

| | | |
|---|---|---|
| EP | 1 363 403 A1 | 11/2003 |
| GB | 2 369 258 A | 5/2002 |
| JP | 3-110930 A | 5/1991 |
| JP | 9-135137 A | 5/1997 |
| JP | 09321675 A | 12/1997 |
| JP | 10173626 A | 6/1998 |
| JP | 2005-244294 A | 9/2005 |
| WO | 2008/077274 A1 | 7/2008 |

* cited by examiner

*Primary Examiner* — Eva Puente
(74) *Attorney, Agent, or Firm* — Jefferson IP Law, LLP

(57) ABSTRACT

An apparatus and method for automatically controlling a gain in a portable communication system are provided. The apparatus includes a channel determiner for controlling a fading margin depending on the channel variation amount to control the limited total dynamic range of the ADC.

16 Claims, 3 Drawing Sheets

APPARATUS AND METHOD FOR AUTOMATICALLY CONTROLLING GAIN IN PORTABLE COMMUNICATION SYSTEM

PRIORITY

This application claims the benefit under 35 U.S.C. §119 (a) to a Korean patent application filed in the Korean Intellectual Property Office on Oct. 17, 2008 and assigned Serial No. 10-2008-0101997, the entire disclosure of which is hereby incorporated by reference.

BACKGROUND OF THE INVENTION

1. Field of the Invention

The present invention relates to an apparatus and method for automatically controlling a gain of a signal in a portable communication system. More particularly, the present invention relates to an apparatus and method for predicting a head room size depending on a channel variation of a time axis and for adjusting the total dynamic range of an Analog to Digital Converter (ADC), thus improving the performance of a receive apparatus in a portable communication system.

2. Description of the Related Art

A wireless communication system is constructed to vary an amount of amplification of a signal depending on a distance and channel environment between a transmit apparatus and a receive apparatus and transmit the signal. If the wireless communication system does not use a suitable amount of amplification for the distance and channel environment between the transmit apparatus and the receive apparatus, the wireless communication system may fail to receive the signal or may cause heavy interference in other Mobile Stations (MSs).

Thus, when transmitting a wireless signal as above, transmitting the wireless signal using too much power of a specific signal has a negative influence on other MSs. That is why the receive apparatus requires a scheme of suitably amplifying a received signal. Thus, the receive apparatus receiving wireless signals has amplifiers for amplifying the received signals.

In addition, when a wireless signal is transmitted as is, it may cause a waste of a bandwidth, a data error, and the like. In order to avoid this problem, the wireless communication system uses a preset coding and modulation scheme for data transmission/reception.

If using the preset coding and modulation scheme as above, the wireless communication system may perform modulation and coding using a specific modem chip device and, in the receive apparatus, perform demodulation and decoding using the modem chip device.

The above automatic gain control process of the portable communication system accumulates a spontaneous power of a signal sampled on a time axis, obtains an average power at a preset time, compares an input reference power value of an Analog to Digital Converter (ADC), and controls a gain amplifier of an input stage of the ADC. At this time, the reference power value of the ADC refers to a Root Mean Square (RMS) of data to be demodulated by an MS.

Thus, the receive apparatus fixes a reference input range for data demodulation at the total input level fixed and a fading margin to overcome a channel variation and fixes the maximum Signal to Noise Ratio (SNR) of an input signal of the ADC to a reference input valid bit.

Thus, the maximum operation region (i.e., dynamic range) of the ADC includes a reference input enabling the receive apparatus to express the required maximum Signal to Quantization Noise power Ratio (SQNR) and a fading margin enabling toleration of the maximum channel variation.

However, the maximum channel variation and maximum SNR required by the receive apparatus form a reciprocity relationship and thus, there is no case where the fixed maximum operation region (i.e., dynamic range) of the ADC is used in all circumstances. Therefore, the above case has a problem of deteriorating the performance of the receive apparatus.

SUMMARY OF THE INVENTION

An aspect of the present invention is to address at least the above problems and/or disadvantages and to provide at least the advantages below. Accordingly, an aspect of the present invention is to provide an automatic gain control apparatus and method for improving the performance of a receive apparatus in a portable communication system.

Another aspect of the present invention is to provide an apparatus and method for predicting a head room size depending on a channel variation and adjusting the total dynamic range of an Analog to Digital Converter (ADC) in a portable communication system.

A further aspect of the present invention is to provide an apparatus and method for adjusting a width of a head room depending on a channel variation in a portable communication system.

The above aspects are addressed by providing an apparatus and method for automatically controlling a gain in a portable communication system.

In accordance with an aspect of the present invention, an apparatus for adjusting the total dynamic range of an ADC depending on a channel variation amount in a receive apparatus is provided. The apparatus includes a channel determiner for controlling a fading margin depending on the channel variation amount to control the limited total dynamic range of the ADC.

In accordance with another aspect of the present invention, a method for adjusting the total dynamic range of an ADC depending on a channel variation amount in a receive apparatus is provided. The method includes controlling a fading margin depending on the channel variation amount and controlling the limited total dynamic range of the ADC.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspect, features, and advantages of certain exemplary embodiments of the present invention will be more apparent from the following description taken in conjunction with the accompanying drawings, in which.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The following description is for a gain control apparatus and method for improving the performance of a receive apparatus, i.e., an apparatus and method for predicting a head room size depending on a channel variation and adjusting the total dynamic range of an Analog to Digital Converter (ADC) in a portable communication system.

Figure 1:
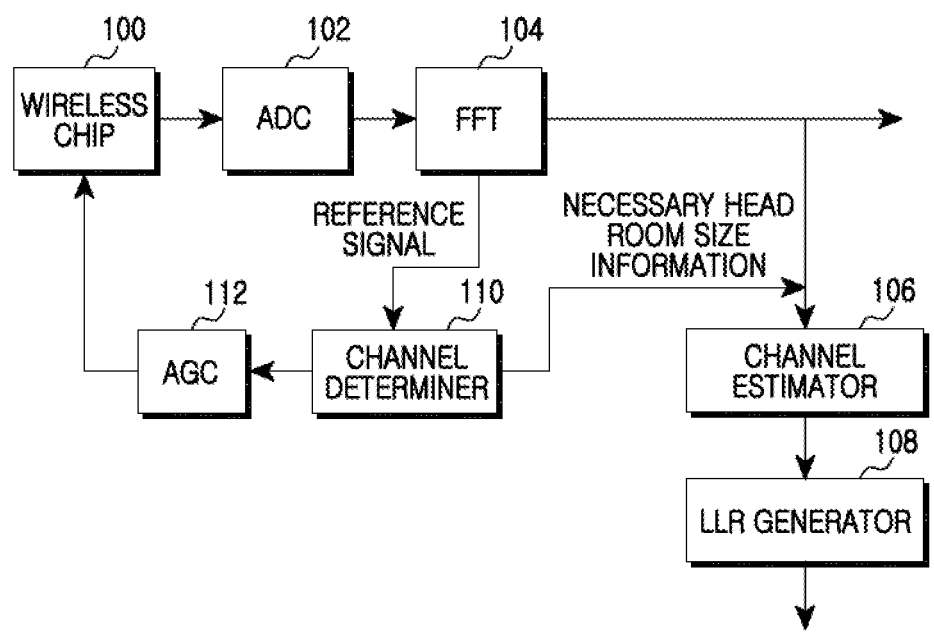
FIG. 1 is a block diagram illustrating a construction of a receive apparatus according to an exemplary embodiment of the present invention.

FIG. 1 is a block diagram illustrating a construction of a receive apparatus according to an exemplary embodiment of the present invention.

Referring to FIG. 1, the receive apparatus may include a wireless chip 100, an ADC 102, a Fast Fourier Transformer (FFT) 104, a channel estimator 106, a Log-Likelihood Ratio (LLR) generator 108, a channel determiner 110, and an Automatic Gain Controller (AGC) 112, and the like.

The wireless chip 100 amplifies a signal received through an antenna (ANT) using a low noise amplifier, and outputs the amplified signal to the ADC 102.

The ADC 102 converts an analog signal input from the wireless chip 100 into a digital signal and then, outputs the digital signal to the AGC 112 and the FFT 104.

Upon receiving the digital signal from the ADC 102, the AGC 112 accumulates a spontaneous power of a signal sampled on a time axis, obtains an average power at a preset time, compares an input reference power value of the ADC 102, and controls an input gain of the ADC 102.

The AGC 112 may control the input gain using a reference input value depending on a channel variation amount provided from the channel determiner 110. That is, if it is determined, by the channel determiner 110, that there is a need for a high input gain according to a large channel variation amount, the AGC 112 performs a process of increasing a head room for the sake of a high gain control and increasing a fading margin. Inversely, if it is determined, by the channel determiner 110, that there is a need for a low input gain according to a small channel variation amount, the AGC 112 performs a process of decreasing the head room for the sake of a low gain control and decreasing the fading margin.

Upon receiving the digital signal from the ADC 102, the FFT 104 transforms an input signal and transforms a time domain signal into a frequency domain signal. The channel estimator 106 performs a channel estimation process for the signal received from the FFT 104 and determines a channel estimation value.

The LLR generator 108 can perform gain control by controlling a head room width using required head room size information received from the channel determiner 110 and the channel estimator 106.

The channel determiner 110 estimates a channel variation amount of a current interval and a channel variation amount of a previous interval, sets an offset value for adjustment of a head room size on the basis of the estimated channel variation amounts, and provides the offset value to the AGC 112. Here, the channel variation amount may be compared to a threshold, wherein the threshold is a previous channel variation.

For example, if it is determined that a channel variation amount is small, i.e., if it is determined that a current channel variation is smaller than a previous channel variation, the channel determiner 110 sets a head room offset for decreasing a fading margin. If it is determined that the channel variation amount is large, i.e., if it is determined that the current channel variation is larger than the previous channel variation, the channel determiner 110 sets a head room offset for increasing the fading margin.

Upon receiving the head room offset value for adjusting the head room width, the AGC 112 adjusts the head room width using the offset value and minimizes an operation region of the ADC 102.

The above description is for an apparatus for predicting a head room size based on a channel variation and adjusting the total dynamic range of an ADC to improve the performance of a receive apparatus in a portable communication system. The following description is for a method for predicting a head room size depending on a channel variation and adjusting the total dynamic range of the ADC using the apparatus according to an exemplary embodiment of the present invention, thus improving the performance of the receive apparatus.

Figure 2:
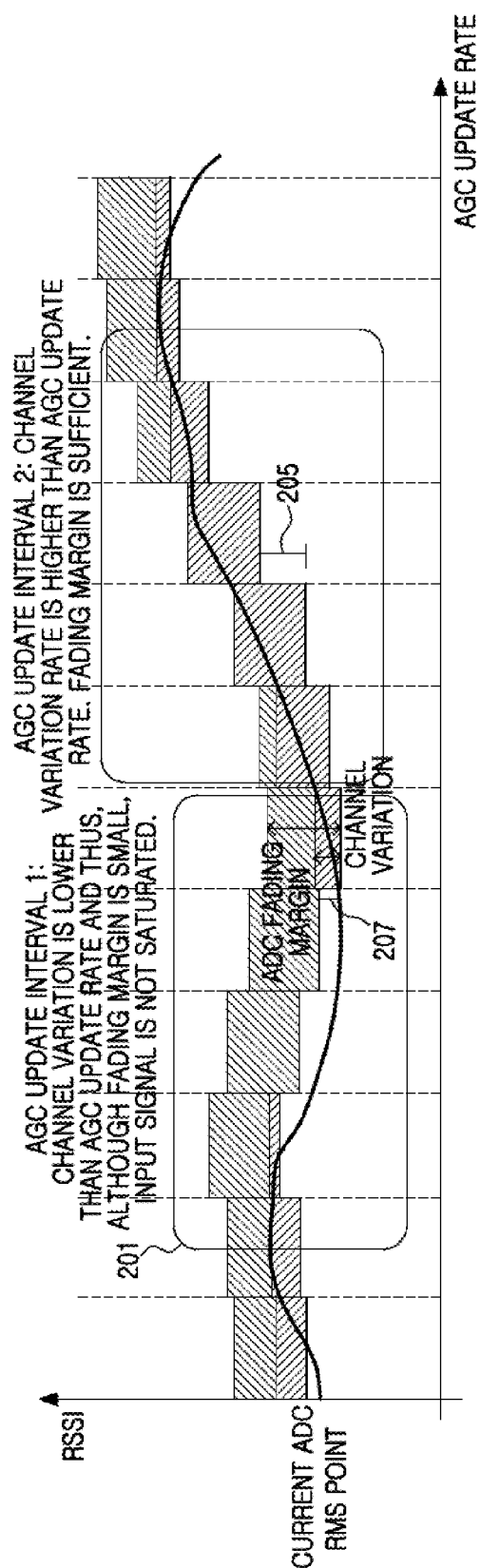
FIG. 2 is a graph illustrating a process of estimating a reference input value depending on a channel state in a receive apparatus according to the present invention.

FIG. 2 is a graph illustrating a process of estimating a reference input value depending on a channel state in a receive apparatus according to an exemplary embodiment of the present invention.

An SNR of a conventional ADC is proportional to an output bit of a valid input signal. Thus, if a valid output signal bit increases by increasing a magnitude of the input signal in the same external environment, the SNR is improved.

However, the total dynamic range of the ADC is limited and thus, an improvement of an SNR due to an increase of a reference input signal and a fading margin is in an exclusive relationship. As a result, the total dynamic range of the ADC is desired for the sake of performance operating at a greater SNR in the same channel circumstances and thus, the greater performance of the ADC is desired.

However, in circumstances in which a channel variation of a receive signal is high, its resultant interference causes a decrease of an SNR of a receive signal, thus decreasing even a required value of a Signal to Quantization Noise power Ratio (SQNR) of a demodulation signal of the receive apparatus. Undoubtedly, if the channel variation decreases, its resultant SNR also increases, however, even a head room required due to the decrease of the channel variation decreases.

As illustrated in FIG. 2, the receive apparatus according to the exemplary embodiment of the present invention improves the performance of the receive apparatus by predicting a head room size depending on a channel variation of a time axis and adjusting the total dynamic range of an ADC.

Referring to FIG. 2, the aforementioned circumstances are described by dividing into a small channel variation amount interval 201 and a large channel variation amount interval 203 in a graph illustrating a channel variation state on a time axis.

In the small channel variation amount interval 201, though a fading margin is small (207), because an input signal is within a head room, the head room decreases. Unlike this, in the large channel variation amount interval 203, the head room increases (205) to set a sufficient fading margin.

As above, the receive apparatus according to the exemplary embodiment of the present invention predicts a head room size required by an ADC depending on a channel variation amount and adjusts the total dynamic range of the ADC, thus improving the performance of the receive apparatus.

Figure 3:
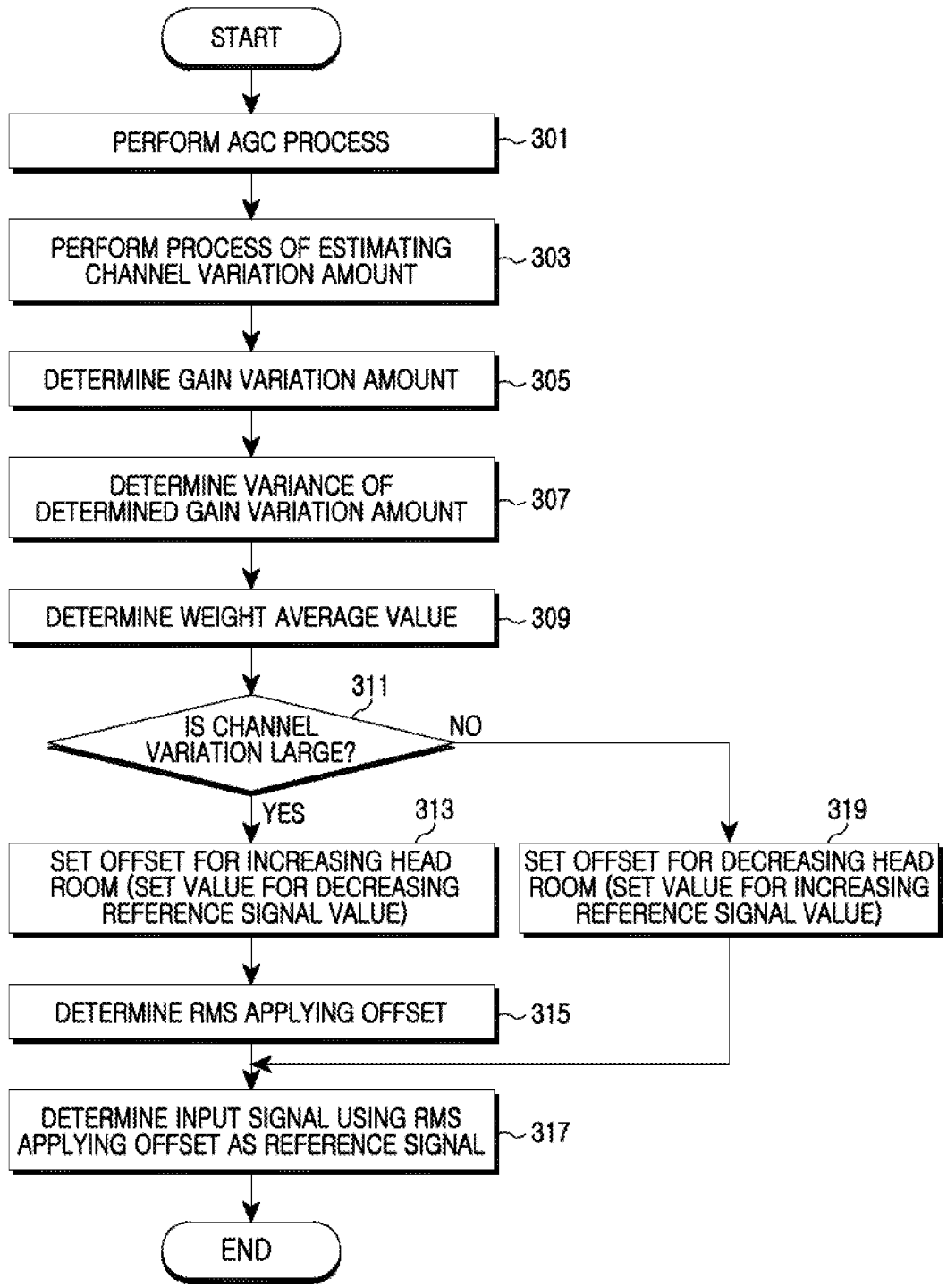
FIG. 3 is a flowchart illustrating a process of performing automatic gain control depending on a channel variation amount in a receive apparatus according to an exemplary embodiment of the present invention.

FIG. 3 is a flowchart illustrating a process of performing automatic gain control depending on a channel variation amount in a receive apparatus according to an exemplary embodiment of the present invention.

Referring to FIG. 3, in step 301, the receive apparatus performs an automatic gain control process and then, proceeds to step 303 and performs a process of estimating a channel variation amount.

The process of estimating the channel variation amount in the receive apparatus is a process of preventing a phenomenon of increasing an operation range of an AGC using a fixed reference input value used in a conventional automatic gain control process, estimating an optimum reference input value depending on a channel variation, and measuring a size of a channel variation to minimize the operation range of the AGC.

In order to perform the channel variation amount estimating process, the receive apparatus proceeds to step 305 and measures a gain variation amount during a specific interval and then, proceeds to step 307 and determines a variance value of the measured gain variation amount, thus being able to estimate the channel variation amount using the determined variance value of the gain variation amount. Here, the receive apparatus may measure the gain variation amount using Equation 1 below and then, measure a variance of the measured gain variation amount using Equation 2 below.

$$M(PWR) = \frac{\sum D(PWR)}{M} \quad (1)$$

In Equation 1, M(PWR) refers to a gain variation amount of a specific interval, M refers to an interval intended to measure a gain variation amount, and D(PWR) refers to a magnitude of an input signal.

$$Var(D) = \frac{\sum (D(PWR) - M(PWR))^2}{M} \quad (2)$$

In Equation 2, Var(D) refers to a variance of a gain variation amount of a specific interval, M refers to an interval intended to measure a gain variation amount, D(PWR) refers to a magnitude of an input signal, and M(PWR) refers to the gain variation amount of the specific interval.

Then, the receive apparatus can proceed to step 309 and determine a weight average value of a variance value determined through Equation 2 and determine a channel variation amount, to adapt to a spontaneous channel variation.

Equation 3 below is an equation for obtaining the weight average value of the gain variation amount. The receive apparatus applies the weight average value of the gain variation amount to a reference input value required for automatic gain control, and performs head room control depending on a channel variation.

$$X = wAvg(Var(D)) \quad (3)$$

In Equation 3, X refers to a weight average value of a gain variation amount, and Var(D) refers to a variance of a gain variation amount of a specific interval.

The receive apparatus can determine whether a channel variation is large or small using the weight average value of the gain variation amount. Thus, the receive apparatus proceeds to step 311 and, according to the above process, compares a channel variation amount of a current interval with a channel variation amount of a previous interval and determines a channel variation amount. Here, the channel variation amount may be compared to a threshold, wherein the threshold is the previous channel variation.

If it is determined that the channel variation amount is large in step 311, i.e., if it is determined that a current channel variation is larger than a previous channel variation, the receive apparatus proceeds to step 313 and sets an offset for increasing a head room.

Step 313 is a step for minimizing an operation range of the ADC by increasing a head room width as the channel variation is large. In step 313, the offset can be set using a difference between a previous channel variation amount and a current channel variation amount. Here, the offset value is a value representing a result (i.e., margin average) of the weight average value of the gain variation amount of Equation 3.

In contrast, if it is determined that the channel variation amount is small in step 311, i.e., if it is determined that the current channel variation is smaller than the previous channel variation, the receive apparatus proceeds to step 319 and sets an offset for decreasing the head room.

Step 319 is a step for setting an offset value for controlling a head room for increasing the input signal as a required head room decreases as the channel variation is small. In step 319, the offset value can be set by applying a response gain to a difference between the current channel variation amount and the previous channel variation amount.

After the offset value is set for controlling the head room width in step 313, the receive apparatus proceeds to step 315 and determines a Root Mean Square (RMS) applying the offset. Here, the receive apparatus determines the RMS using Equation 4 below, thus being able to determine a value for gain control.

$$RMS_{AGC} = PreviousRMS_{AGC} - offset \quad (4)$$

That is, the receive apparatus sets an offset value for controlling a head room width depending on a channel variation amount as above. However, if it is determined that there is no channel variation amount, the receive apparatus determines a value for gain control according to a conventional method.

Then, in step 317, the receive apparatus determines an input signal that uses, as a reference signal, the RMS applying the offset, and determines a value for gain control.

That is, the receive apparatus determines the value for gain control using Equation 5 below.

$$G(PWR) = 20 \log_{10}\left(\frac{PWR(t)}{RMS}\right) \quad (5)$$

In Equation 5, G(PWR) refers to a gain control value, PWR(t) refers to an accumulated average input value, and RMS refers to an RMS value applying an offset determined according to an exemplary embodiment of the present invention and is a value representing a result (i.e., a margin average) of a weight average value of a gain variation amount.

After that, the receive apparatus terminates the process.

As described above, exemplary embodiments of the present invention predicts a head room size depending on a channel variation of a time axis in a receive apparatus and adjusts the total dynamic range of an ADC, thus being able to reduce the performance of an ADC required in a conventional receive apparatus using the total dynamic range fixed and improve the performance of the whole receive apparatus.

While the invention has been shown and described with reference to certain preferred embodiments thereof, it will be understood by those skilled in the art that various changes in form and details may be made therein without departing from the spirit and scope of the invention as defined by the appended claims and their equivalents.

What is claimed is:

1. An apparatus for adjusting the total dynamic range of an Analog to Digital Converter (ADC) depending on a channel variation amount in a receive apparatus, the apparatus comprising:
    a channel determiner for
        determining the channel variation amount, which relates to an extent to which a magnitude of an input signal varies over a specific interval, using a gain variation amount and a magnitude of the input signal during the specific interval, and
        controlling a fading margin depending on the channel variation amount to control the total dynamic range of the ADC,
    wherein the channel determiner sets an offset for increasing or decreasing the fading margin based on a comparison between the channel variation amount and a threshold, and
    wherein the channel determiner determines the channel variation amount using a weight average value of a variance value of the gain variation amount, to adapt a spontaneous channel variation.

2. The apparatus of claim 1, wherein the channel determiner determines the gain variation amount using the equation below:

$$M(PWR) = \frac{\sum D(PWR)}{M}$$

where, M(PWR) refers to a gain variation amount of a specific interval, M refers to an interval intended to measure a gain variation amount, and D(PWR) refers to the magnitude of the input signal.

3. The apparatus of claim 1, wherein the channel determiner determines the variance value of the gain variation amount using the equation below:

$$Var(D) = \frac{\sum (D(PWR) - M(PWR))^2}{M}$$

where, Var(D) refers to a variance of a gain variation amount of a specific interval, M refers to an interval intended to measure a gain variation amount, D(PWR) refers to a magnitude of an input signal, and M(PWR) refers to a gain variation amount of a specific interval.

4. The apparatus of claim 1, wherein, if it is determined that the channel variation amount is higher than the threshold, the channel determiner sets the offset so as to increase the fading margin and, if it is determined that the channel variation amount is lower than the threshold, sets the offset so as to decrease the fading margin, to control the total dynamic range of the ADC.

5. The apparatus of claim 4, wherein the threshold comprises a previous channel variation amount.

6. The apparatus of claim 4, wherein the channel determiner determines a Root Mean Square (RMS) applying the offset set depending on the channel variation amount and, by using the RMS as a reference signal for gain control, controls the total dynamic range of the ADC.

7. The apparatus of claim 6, wherein the channel determiner determines a value for the gain control by using the RMS as the reference signal.

8. The apparatus of claim 7, wherein the value for the gain control is determined using the equation below:

$$G(PWR) = 20 \log_{10}\left(\frac{PWR(t)}{RMS}\right)$$

where, G(PWR) refers to a gain control value, PWR(t) refers to an accumulated average input value, and RMS refers to an RMS value.

9. A method for adjusting the total dynamic range of an Analog to Digital Converter (ADC) depending on a channel variation amount in a receive apparatus, the method comprising:
    determining, by a channel determiner, the channel variation amount, which relates to an extent to which a magnitude of an input signal varies over a specific interval, using a gain variation amount and a magnitude of the input signal during the specific interval;
    controlling, by the channel determiner, a fading margin depending on the channel variation amount; and
    controlling the total dynamic range of the ADC,
    wherein the channel determiner sets an offset for increasing or decreasing the fading margin based on a comparison between the channel variation amount and a threshold, and
    wherein the channel determiner determines the channel variation amount using a weight average value of a variance value of the gain variation amount, to adapt a spontaneous channel variation.

10. The method of claim 9, wherein the gain variation amount is determined using the equation below:

$$M(PWR) = \frac{\sum D(PWR)}{M}$$

where, M(PWR) refers to a gain variation amount of a specific interval, M refers to an interval intended to measure a gain variation amount, and D(PWR) refers to the magnitude of the input signal.

11. The method of claim 9, wherein the variance value of the gain variation amount is determined using the equation below:

$$\mathrm{Var}(D) = \frac{\sum (D(PWR) - M(PWR))^2}{M}$$

where, Var(D) to a variance of a gain variation amount of a specific interval, M refers to an interval intended to measure a gain variation amount, D(PWR) refers to a magnitude of an input signal, and M(PWR) refers to a gain variation amount of a specific interval.

12. The method of claim 9, wherein the controlling of the total dynamic range of the ADC further comprises:
if it is determined that the channel variation amount is higher than the threshold, setting the offset so as to increase the fading margin; and
if it is determined that the channel variation amount is lower than the threshold, setting the offset so as to decrease the fading margin.

13. The method of claim 12, wherein the threshold comprises a previous channel variation amount.

14. The method of claim 12, wherein the controlling of the total dynamic range of the ADC further comprises:
determining a Root Mean Square (RMS) applying an offset set depending on the channel variation amount; and
using the RMS as a reference signal for gain control.

15. The method of claim 14, wherein the using of the RMS as the reference signal for the gain control comprises determining a value for the gain control.

16. The method of claim 15, wherein the value for the gain control is determined using the equation below:

$$G(PWR) = 20 \, \log_{10}\!\left(\frac{PWR(t)}{RMS}\right)$$

where, G(PWR) refers to a gain control value, PWR(t) refers to an accumulated average input value, and RMS refers to an RMS value.

\* \* \* \* \*